US008546846B2

(12) United States Patent
Kim et al.

(10) Patent No.: US 8,546,846 B2
(45) Date of Patent: Oct. 1, 2013

(54) NITRIDE SEMICONDUCTOR LIGHT EMITTING DEVICE

(75) Inventors: Min-Ho Kim, Gyunggi-do (KR); Martin F. Schubert, Troy, NY (US); Jong Kyu Kim, Watervliet, NY (US); F. Fred Schubert, Troy, NY (US); Yongio Park, Gyunggi-do (KR); Cheolsoo Sone, Gyunggi-do (KR); Sukho Yoon, Seoul (KR)

(73) Assignees: Samsung Electronics Co., Ltd., Suwon (KR); Rensselaer Polytechnic Institute, Troy, NY (US)

( * ) Notice: Subject to any disclaimer, the term of this patent is extended or adjusted under 35 U.S.C. 154(b) by 214 days.

(21) Appl. No.: 13/064,186

(22) Filed: Mar. 9, 2011

(65) Prior Publication Data

US 2012/0132887 A1 May 31, 2012

Related U.S. Application Data

(63) Continuation-in-part of application No. 12/195,077, filed on Aug. 20, 2008, now abandoned.

(60) Provisional application No. 60/956,723, filed on Aug. 20, 2007.

(51) Int. Cl.
*H01L 33/00* (2010.01)

(52) U.S. Cl.
USPC ............................................. 257/103

(58) Field of Classification Search
USPC ............................................. 257/103
See application file for complete search history.

(56) References Cited

U.S. PATENT DOCUMENTS

| 5,289,486 A * | 2/1994 | Iga et al. ............ 372/45.012 |
| 5,583,878 A * | 12/1996 | Shimizu et al. ........ 372/45.01 |
| 6,515,308 B1 | 2/2003 | Kneissi et al. |
| 6,943,381 B2 * | 9/2005 | Gardner et al. ............ 257/103 |
| 2001/0030317 A1 | 10/2001 | Lee et al. |
| 2003/0178702 A1 | 9/2003 | Sawaki et al. |
| 2005/0167690 A1 | 8/2005 | Gardner et al. |

(Continued)

FOREIGN PATENT DOCUMENTS

| JP | 2003-347585 | 12/2003 |
| JP | 2005-217421 | 8/2005 |

OTHER PUBLICATIONS

Japanese Office Action mailed Oct. 11, 2011 issued in corresponding Japanese Patent Application No. 2008-212194.

(Continued)

*Primary Examiner* — Yu-Hsi D Sun

(57) ABSTRACT

A nitride semiconductor light emitting device includes n-type and p-type nitride semiconductor layers; an active layer disposed between the n-type and p-type nitride semiconductor layers and having a structure in which a plurality of quantum barrier layers and one or more quantum well layers are alternately stacked; and an electron blocking layer disposed between the active layer and the p-type nitride semiconductor layer. The electron blocking layer has a superlattice structure in which two or more layers having different compositions are alternately stacked. An absolute value of a net polarization mismatch between a material, the material having a composition corresponding to an average composition of the superlattice structure, and a quantum barrier layer adjacent to the electron blocking layer among the plurality of quantum barrier layers is less than ⅔ of an absolute value of a net polarization mismatch between $Al_xG_{1-x}N(0<x<1)$ having bandgap energy equal to that of the material and a composition different thereto and the adjacent quantum barrier layer.

17 Claims, 9 Drawing Sheets

(56) References Cited

U.S. PATENT DOCUMENTS

2005/0169333 A1* 8/2005 Watanabe et al. ............ 372/45

OTHER PUBLICATIONS

U.S. Appl. No. 12/923,195, filed Sep. 8, 2010, Min-Ho Kim et al., Samsung Electro-Mechanics Co., Ltd. and Rensselaer Polytechnic Institute.

Japanese Office Action dated Sep. 6, 2011 issued in correspondence with Japanese Patent Application No. 2008-212193.

U.S. Patent Office Action mailed Mar. 2, 2012 in related U.S. Appl. No. 12/923,195.

Japanese Office Action mailed Feb. 28, 2012 issued in related Japanese Patent Application No. 2008-212194.

* cited by examiner

NITRIDE SEMICONDUCTOR LIGHT EMITTING DEVICE

CROSS-REFERENCE TO RELATED APPLICATIONS

This application is a continuation-in-part of and claims the benefit of priority to U.S. patent application Ser. No. 12/195,077, filed on Aug. 20, 2008, now abandoned, which further is based on and claims the priority benefit of U.S. Provisional Application No. 60/956,723 filed on Aug. 20, 2007, the disclosures of which are incorporated herein by reference.

BACKGROUND

1. Field

The present invention relates to a nitride semiconductor light emitting device, and more particularly, to a nitride semiconductor light emitting device capable of minimizing a decrease in light emission efficiency at high currents.

2. Description of the Related Art

A light emitting diode (LED) is a semiconductor device that can emit light of various colors due to electron-hole recombination occurring at a p-n junction when a current is applied thereto. Compared to conventional lighting sources such as incandescent lighting bulbs and fluorescent lamps, LED has many advantages such as a long lifespan, low power, excellent initial-operation characteristics, and high tolerance to repetitive power on/off. Hence the demand for LED is continuously increasing. Particularly, group III nitride semiconductors that can emit light in the blue/short wavelength region have recently drawn much attention.

However, in a light emitting device using the group III nitride semiconductor, electrons that have a higher mobility than holes flow to a p-type semiconductor layer without combining with the holes. This, as shown in FIG. 1, causes an electron leakage current to increase as the magnitude of currents being injected increases. The increase in the electron leakage current is called electron overflow. FIG. 1 is a graph showing a change in the electron leakage current according to injection currents in a related art nitride semiconductor light emitting device.

The electron leakage current decreases quantum efficiency, and is becoming a more crucial limitation because LEDs are increasingly being used at high currents as in lighting devices. However, no methods have been proposed to completely overcome this limitation. Therefore, there is a need for a high-efficiency nitride semiconductor light emitting device that has high quantum efficiency in every current region, especially at high currents, and thus can be used for a lighting device or the like.

SUMMARY

An aspect of the present invention provides a nitride semiconductor light emitting device which can achieve high efficiency by minimizing a net polarization mismatch between a quantum barrier layer and an electron blocking layer.

According to an aspect of the present invention, there is provided a nitride semiconductor light emitting device including: n-type and p-type nitride semiconductor layers; an active layer disposed between the n-type and p-type nitride semiconductor layers and having a structure in which a plurality of quantum barrier layers and one or more quantum well layers are alternately stacked; and an electron blocking layer disposed between the active layer and the p-type nitride semiconductor layer, wherein the electron blocking layer has a superlattice structure in which two or more layers having different compositions are alternately stacked, and an absolute value of a net polarization mismatch between a material, the material having a composition corresponding to an average composition of the superlattice structure, and a quantum barrier layer adjacent to the electron blocking layer among the plurality of quantum barrier layers is less than two thirds (⅔) of an absolute value of a net polarization mismatch between $Al_xG_{1-x}N$ (0<x<1) having bandgap energy equal to that of the material and a composition different thereto and the adjacent quantum barrier layer.

The absolute value of the net polarization mismatch between the material and the adjacent quantum barrier layer may be less than half (½) of the absolute value of the net polarization mismatch between $Al_xG_{1-x}N$ (0<x<1) and the adjacent quantum barrier layer.

The absolute value of the net polarization mismatch between the material and the adjacent quantum barrier layer may be equal to the absolute value of the net polarization mismatch between $Al_xG_{1-x}N$ (0<x<1) and the adjacent quantum barrier layer.

In $Al_xGN$ (0<x<1), x may be greater than or equal to 0.1 and less than or equal to 0.2.

The adjacent quantum barrier layer may be formed of GaN.

The average composition of the superlattice structure may be a quaternary composition including Al, Ga, In and N.

The superlattice structure may include superlattice barrier and well layers, and an absolute value of a net polarization mismatch between the superlattice barrier and well layers may be less than two thirds (⅔) of an absolute value of a net polarization mismatch between $Al_yG_{1-y}N$ (0<y<1) having bandgap energy equal to that of the superlattice barrier layer and a composition different thereto and the superlattice well layer.

The absolute value of the net polarization mismatch between the superlattice barrier and well layers may be less than half (½) of the absolute value of the net polarization mismatch between $Al_yG_{1-y}N$ (0<y<1) and the superlattice well layer.

The absolute value of the net polarization mismatch between the superlattice barrier and well layers may be equal to the absolute value of the net polarization mismatch between $Al_yG_{1-y}N$ (0<y<1) and the superlattice well layer.

The superlattice barrier layer may have a quaternary composition including Al, Ga, In and N, and the superlattice well layer may be formed of GaN.

In $Al_yG_{1-y}N$ (0<y<1), y may be greater than or equal to 0.2 and less than or equal to 0.4.

The electron blocking layer may include a polarization matching layer disposed between the superlattice structure and the adjacent quantum barrier layer so as to be in contact with the adjacent quantum barrier layer and having a net polarization equal to that of the adjacent quantum barrier layer.

The polarization matching layer may have greater bandgap energy than the adjacent quantum barrier layer.

According to another aspect of the present invention, there is provided a nitride semiconductor light emitting device including: n-type and p-type nitride semiconductor layers; an active layer disposed between the n-type and p-type nitride semiconductor layers and having a structure in which a plurality of quantum barrier layers and one or more quantum well layers are alternately stacked; and an electron blocking layer disposed between the active layer and the p-type nitride semiconductor layer, wherein the electron blocking layer has a superlattice structure in which two or more layers having different compositions are alternately stacked, the superlattice structure includes superlattice barrier and well layers, and an absolute value of a net polarization mismatch between the superlattice barrier and well layers is less than two thirds (2/3) of an absolute value of a net polarization mismatch between $Al_yG_{1-y}N$ (0<y<1) having bandgap energy equal to that of the superlattice barrier layer and a composition different thereto and the superlattice well layer.

The absolute value of the net polarization mismatch between the superlattice barrier and well layers may be less than half (1/2) of the absolute value of the net polarization mismatch between $Al_yG_{1-y}N$ (0<y<1) and the superlattice well layer.

The absolute value of the net polarization mismatch between the superlattice barrier and well layers may be equal to the absolute value of the net polarization mismatch between $Al_yG_{1-y}N$ (0<y<1) and the superlattice well layer.

According to another aspect of the present invention, there is provided a nitride semiconductor light emitting device including: n-type and p-type nitride semiconductor layers; and an active layer disposed between the n-type and p-type nitride semiconductor layers and having a structure in which a plurality of quantum barrier layers and one or more quantum well layers are alternately stacked; wherein at least one of the plurality of quantum barrier layers has a superlattice structure in which two or more layers having different compositions are alternately stacked, and an absolute value of a net polarization mismatch between a material, the material having a composition corresponding to an average composition of the superlattice structure, and a quantum well layer adjacent to the superlattice structure is less than two thirds (2/3) of an absolute value of a net polarization mismatch between $In_xG_{1-x}N$ (0≤x<1) having bandgap energy equal to that of the material and a composition different thereto and the adjacent quantum well layer.

In $In_xG_{1-x}N$ (0≤x<1), x may be 0.

The quantum barrier layer having the superlattice structure may include a polarization matching layer disposed between the superlattice structure and the adjacent quantum well layer so as to be in contact with the adjacent quantum well layer and having a net polarization equal to that of the adjacent quantum well layer.

BRIEF DESCRIPTION OF THE DRAWINGS

The above and other aspects, features and other advantages of the present invention will be more clearly understood from the following detailed description taken in conjunction with the accompanying drawings, in which.

DESCRIPTION OF EMBODIMENTS

Figure 1:
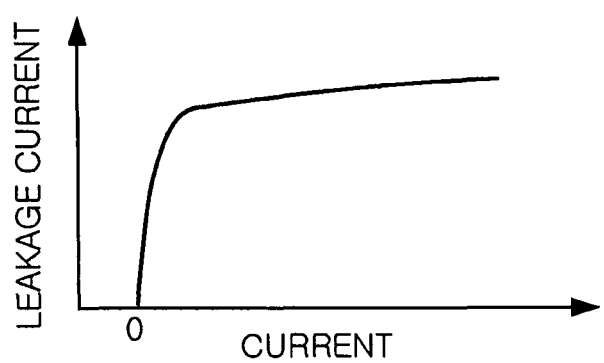
FIG. 1 is a graph showing a change in electron leakage current according to an injection current in a related art nitride semiconductor light emitting device.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions and the shapes of elements are exaggerated for clarity of illustration. Like reference numerals refer to like elements throughout.

Figure 2A:
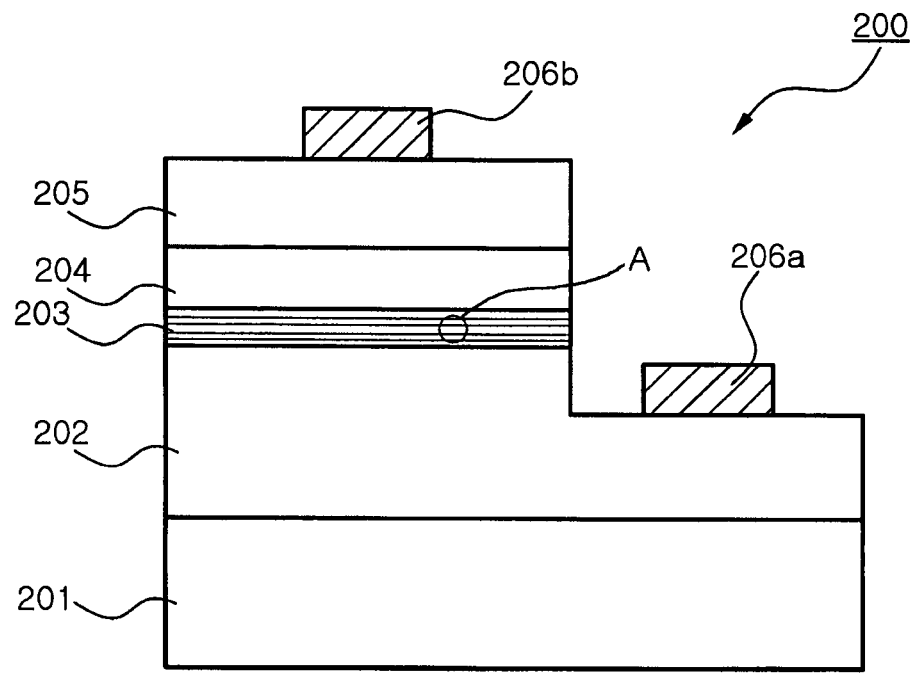
FIG. 2A is a cross-sectional view of a nitride semiconductor light emitting device according to an exemplary embodiment of the present invention.
Figure 2B:
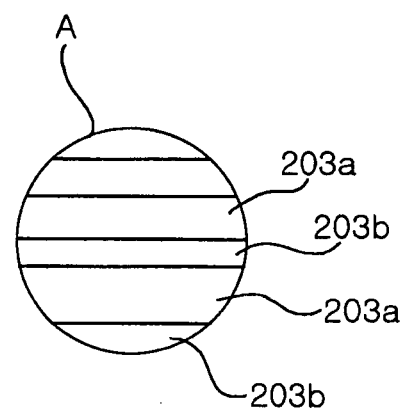
FIG. 2B is an enlarged view of an active layer region of FIG. 2A.

FIG. 2A is a cross-sectional view of a nitride semiconductor light emitting device according to an exemplary embodiment of the present invention. FIG. 2B is an enlarged view of an active layer region of FIG. 2A. Referring to FIGS. 2A and 2B, a nitride semiconductor light emitting device 200 according to the current embodiment includes an n-type nitride semiconductor layer 202, an active layer 203, an electron blocking layer 204 and a p-type nitride semiconductor layer 205 sequentially disposed on a substrate 201. N-type and p-type electrodes 206a and 206b are disposed at predetermined regions of the n-type and p-type nitride semiconductor layers 202 and 205, respectively.

The substrate 201 is provided for growth of a nitride semiconductor layer, and a sapphire substrate may be used as the substrate 201. The sapphire substrate is formed of a crystal having Hexa-Rhombo R3c symmetry, and has a lattice constant of 13.001 Å along a C-axis and a lattice constant of 4.758 Å along an A-axis. Orientation planes of the sapphire substrate include a C (0001) plane, an A (1120) plane, an R (1102) plane, etc. Particularly, the C plane is mainly used as a substrate for nitride growth because it relatively facilitates the growth of a nitride film and is stable at a high temperature.

The C plane is a polar plane. A nitride semiconductor layer grown from the C plane has a spontaneous polarization because of intrinsic ionicity of a nitride semiconductor and structural asymmetry (lattice constant a≠c). If nitride semiconductors having different lattice constants are successively stacked, a strain occurring at each semiconductor layer causes a piezoelectric polarization. The sum of those two polarizations is called a net polarization. Net polarization mismatch is formed at each interface by the net polarization, thereby bending an energy-level. The energy-level bending in an active layer causes spatial mismatch between wave functions of electrons and holes, lowering the light emission efficiency. A technique for improving the light emission efficiency by reducing an influence of polarizations will be described in detail. As the substrate 201 for growth of the nitride semiconductor, a substrate formed of SiC, Si, GaN, AlN or the like may be used instead of the sapphire substrate.

In the current embodiment, a nitride semiconductor light emitting device having a horizontal structure including the substrate 201 for growth of a nitride semiconductor is described. However, the present invention is not limited thereto and may be applied to a nitride semiconductor light emitting device having a vertical structure in which electrodes face each other in a stacked direction of semiconductor layers with the substrate 201 removed.

The n-type nitride semiconductor layer 202 and the p-type nitride semiconductor layer 205 may be formed of semiconductor materials having a composition formula $Al_xIn_yGa_{(1-x-y)}N$ ($0 \leq x \leq 1$, $0 \leq y \leq 1$ and $0 \leq x+y \leq 1$) and doped with n-type impurities and p-type impurities, respectively. Representative examples of the semiconductor material include GaN, AlGaN and InGaN. Si, Ge, Se, Te or the like may be used as the n-type impurities, and Mg, Zn, Be or the like may be used as the p-type impurities. With respect to growth of a nitride semiconductor layer, a known process may be used for the n-type and p-type nitride semiconductor layers 202 and 205. For example, the known process may be, e.g., metal-organic chemical vapor deposition (MOCVD), molecular beam epitaxy (MBE) or hydrid vapor-phase epitaxy (HVPE).

As shown in FIG. 2B, the active layer 203 has a stack structure in which quantum barrier layers 203a and quantum well layers 203b are alternately stacked on top of each other so as to emit light through electron-hole recombination at the quantum well layers 203b. In this case, the quantum barrier layer 203a is formed of GaN, and the quantum well layer 203b may be formed of $In_{0.2}Ga_{0.8}N$. The electron blocking layer 204 is disposed between the active layer 203 and the p-type nitride semiconductor layer 205, and has higher bandgap energy than the quantum barrier layer 203a. Accordingly, the electron blocking layer 204 prevents electrons from overflowing to the p-type nitride semiconductor layer 205.

According to the current embodiment, a net polarization mismatch between the electron blocking layer 204 and the adjacent quantum barrier layer 203a is less than that of a conventional quantum barrier layer/electron blocking layer structure. Accordingly, if the net polarization mismatch at an interface is made to be less than a related art, for example, a GaN quantum barrier layer/$Al_{0.13}Ga_{0.87}N$ electron blocking layer structure, energy-level bending at the electron blocking layer and the adjacent quantum barrier layer decreases, whereby the electron leakage current over the electron blocking layer decreases. Thus, as will be described later, the driving voltage and electron leakage current decrease, and the light emission efficiency can be improved.

Figure 3:
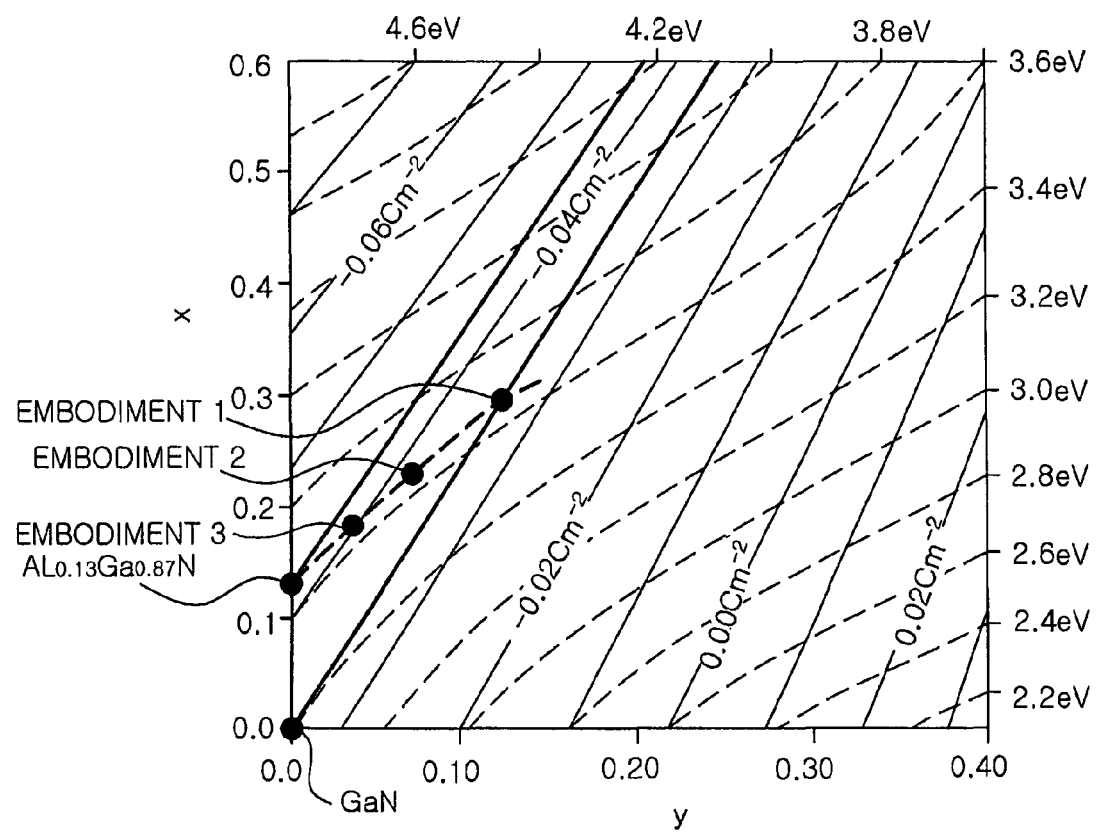
FIG. 3 illustrates changes in bandgap energy and net polarizations according to Al(x) and In(y) compositions in an AlInGaN quaternary semiconductor.

Hereinafter, a method for reducing the net polarization mismatch between the quantum barrier layer and the electron blocking layer according to the current embodiment and effects thereof will now be described. FIG. 3 illustrates changes in bandgap energy and net polarizations with respect to Al(x) and In(y) compositions in an AlInGaN quaternary semiconductor. In this case, the compositions of the same bandgap energy are indicated by a dotted line, and the compositions of the same net polarization are indicated by a solid line. The graph of FIG. 3 is obtained from a calculation considering a bowing parameter and a lattice constant of each element after determining the net polarizations and the bandgap energy of AlN, InN and GaN grown on the GaN layer at a temperature of 300 K.

Referring to FIG. 3, as the Al content of the AlInGaN semiconductor layer increases, the bandgap energy increases and the net polarization decreases. Also, as the In content of the AlInGaN semiconductor layer increases, the bandgap energy decreases and the net polarization increases. However, the degree of changes in bandgap energy and net polarization varies according to changes in Al and In contents. Thus, it can be seen that if the Al and In contents are properly controlled, the net polarization can be reduced while the constant bandgap energy is maintained.

In more detail, as shown in FIG. 3, the bandgap energy of a GaN quantum barrier layer is 3.4200 eV, and the net polarization is $-0.0339$ $C/m^2$. In this case, the minus quantity of the net polarization may be understood as indicating that the GaN quantum barrier layer is positively charged toward a GaN layer at a lower side, and is negatively charged at the opposite side. Also, in the case of a related art $Al_{0.13}Ga_{0.87}N$ electron blocking layer, the bandgap energy is 3.6588 eV, and the net polarization is $-0.0423$ $C/m^2$. According to the current embodiment, two compositions are determined for formation of electron blocking layers (embodiments 1 and 2) such that the bandgap energy thereof is similar to that of $Al_{0.13}Ga_{0.87}N$ to maintain an electron blocking function while the net polarization mismatch with respect to an adjacent quantum barrier layer is reduced. That is, conditions of a usable electron blocking layer according to the current embodiment include bandgap energy higher than the adjacent quantum barrier layer, and the net polarization less than or equal to the adjacent quantum barrier layer.

Table 1 below shows calculation results of the net polarization and the bandgap energy of the embodiments 1 and 2, as well as those of a related art $Al_{0.13}Ga_{0.87}N$ electron blocking layer and a GaN quantum barrier layer. In this case, the electron blocking layer ($Al_{0.3}In_{0.13}Ga_{0.57}N$) of the embodiment 1 has the same bandgap energy as $Al_{0.13}Ga_{0.87}N$ and the same net polarization as the GaN quantum barrier layer. Also, the electron blocking layer ($Al_{0.25}In_{0.08}Ga_{0.67}N$) of the embodiment 2 has the same bandgap energy as $Al_{0.13}Ga_{0.87}N$ and the net polarization mismatch with the GaN quantum barrier layer, which is half the net polarization mismatch between $Al_{0.13}Ga_{0.87}N$ and the GaN quantum barrier layer. In Table 1 below, QB represents a quantum barrier layer.

TABLE 1

|  | Composition | Bandgap energy (eV) | Net polarization (C/m2) |
| --- | --- | --- | --- |
| Embodiment 1 | $Al_{0.3}In_{0.13}Ga_{0.57}N$ | 3.6588 | −0.0339 |
| Embodiment 2 | $Al_{0.25}In_{0.08}Ga_{0.67}N$ | 3.6588 | −0.0381 |
| Comparison example 1 | $Al_{0.13}Ga_{0.87}N$ | 3.6588 | −0.0423 |
| QB | GaN | 3.4200 | −0.0339 |

Figure 4:
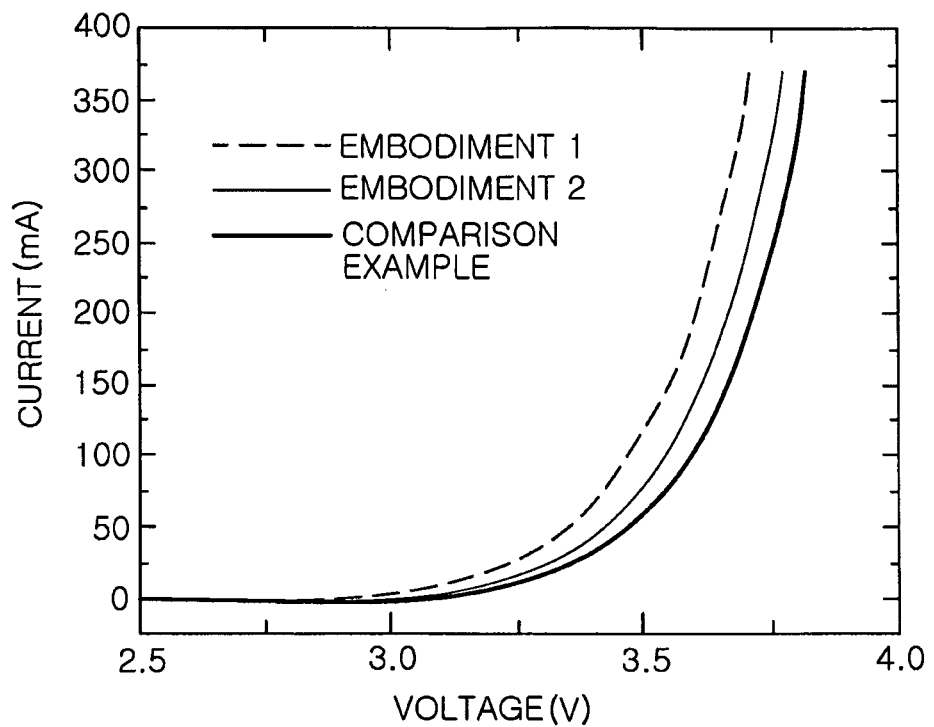
FIG. 4 is a graph showing the results of the simulation of current changes according to a driving voltage change in embodiments 1 and 2 and a comparison example ($Al_{0.13}Ga_{0.87}N$ electron blocking layer) selected as shown in Table 1.

FIG. 4 is a graph showing the results of the simulation concerning current changes according to a driving-voltage change in the embodiments 1 and 2 and the comparison example ($Al_{0.13}Ga_{0.87}N$ electron blocking layer) selected as shown in Table 1. In this case, the emission wavelength is 450 nm and the temperature conditions is set to 300 K. However, an influence of a crystalline feature or the like of a semiconductor layer is not considered. Referring to FIG. 4, driving voltages of the embodiments 1 and 2 are lower than a driving voltage of the comparison example. Particularly, it can be seen that the embodiment 1 in which the electron blocking layer has the same net polarization as the quantum barrier layer shows the best result. In the case of the comparison example, the absolute value of the net polarization of the electron blocking layer is greater than that of an adjacent quantum barrier layer. Thus, the magnitude of the positive of the electron blocking layer is greater than that of the quantum barrier layer at an interface between the electron blocking layer and the quantum barrier layer. Accordingly, the interface is positively charged, and this induces electrons flowing toward the electron blocking layer, degrading an electron blocking effect. In the embodiments 1 and 2, the net polarization mismatch does not exist or is reduced as compared to the comparison example at an interface between the electron blocking layer and the quantum barrier layer, thereby reducing the electron leakage over the electron blocking layer.

Figure 5:
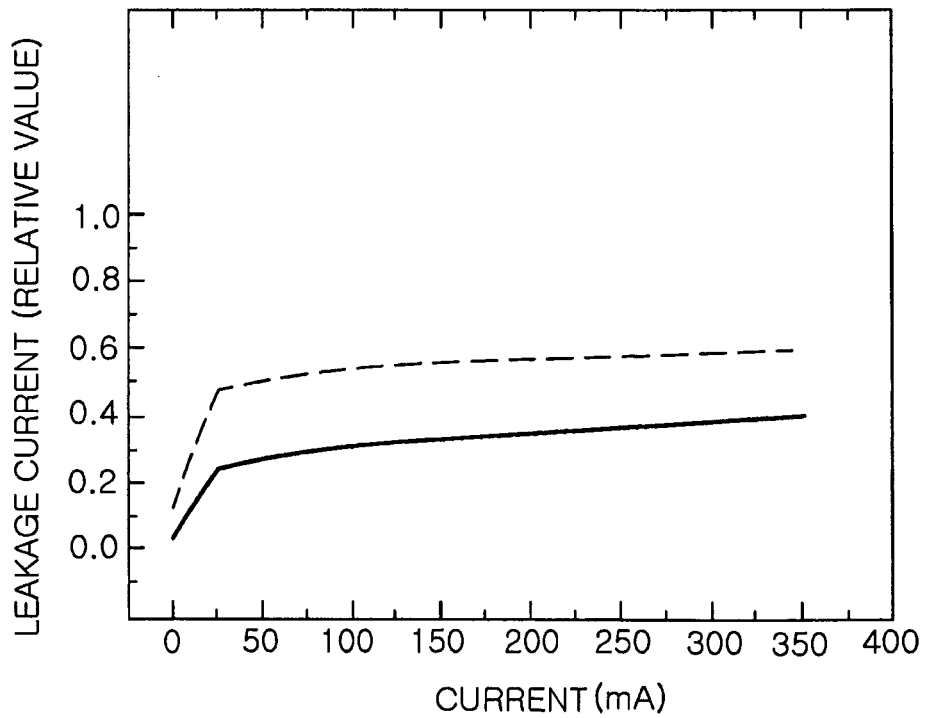
FIG. 5 is a graph showing the results of the simulation of changes in electron leakage current according to a current change in the embodiment 1 (solid line) and the comparison example (dotted line)
Figure 6:
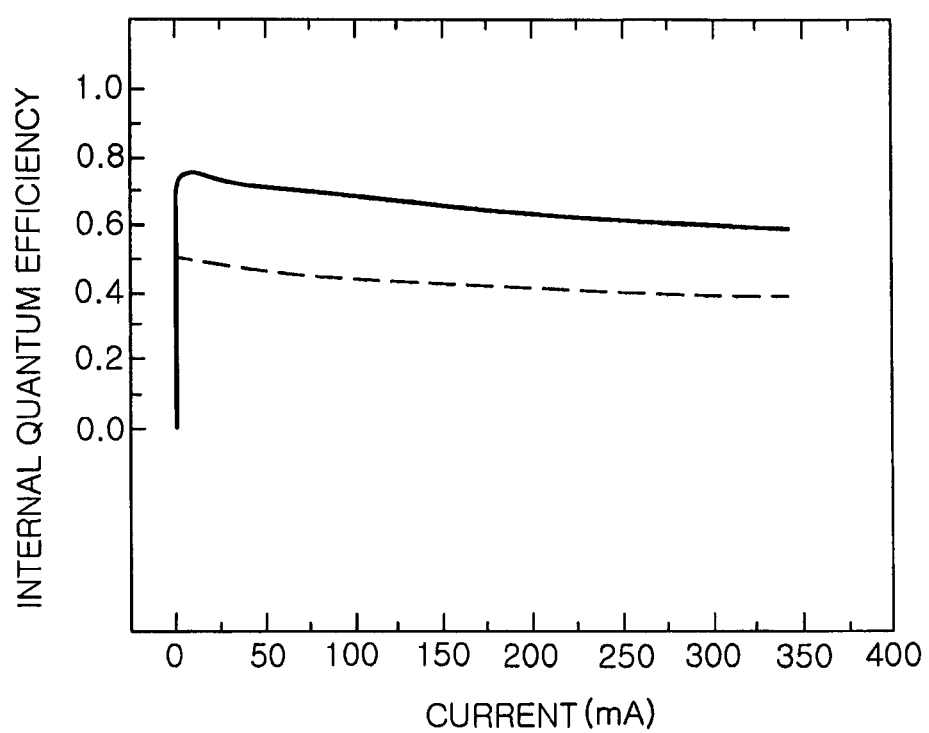
FIG. 6 is a graph showing the results of the simulation of changes in internal quantum efficiency according to a current change in the embodiment 1 (solid line) and the comparison example (dotted line)

FIG. 5 is a graph showing the results of the simulation of changes in electron leakage current according to a current change in the embodiment 1 (solid line) and the comparison example (dotted line). FIG. 6 is a graph showing the results of the simulation of changes in internal quantum efficiency according to a current change in the embodiment 1 (solid line) and the comparison example (dotted line). Referring to FIG. 5, the amount of electron leakage currents is much smaller in the embodiment 1 than in the comparison example. This means that the electron blocking function is affected by the form of the energy level associated with the net polarization at the electron blocking layer. That is, according to the current embodiment, if the energy-level bending of the electron blocking layer is minimized, the electron blocking function can be improved. Referring to FIG. 6, as for the internal quantum efficiency at high currents, it can be seen that the quantum efficiency of the comparison example decreases by about 25% at 350 mA as compared to the maximum quantum efficiency, and the quantum efficiency of the embodiment 1 decreases by about 22%. Particularly, the internal quantum efficiency of the embodiment 1 is much higher than that of the comparison example, and efficiency improvement of about 49.5% is achieved at 350 mA.

A method for controlling Al and In contents is described according to the current embodiment. However, this method is merely one way of reducing the net polarization mismatch between the quantum barrier layer and the electron blocking layer or of reducing the degree of the energy-level bending of the electron blocking layer. Also, the method for reducing the net polarization mismatch may be also applied between the electron blocking layer and a p-type semiconductor layer, not just between the quantum barrier layer and the electron blocking layer. Also, the method for reducing the net polarization mismatch may also be applied to an interface of every layer adjacent to the electron blocking layer, e.g., between the electron blocking layer and a nitride spacer layer interposed between an active layer and the electron blocking layer.

Figure 7A:
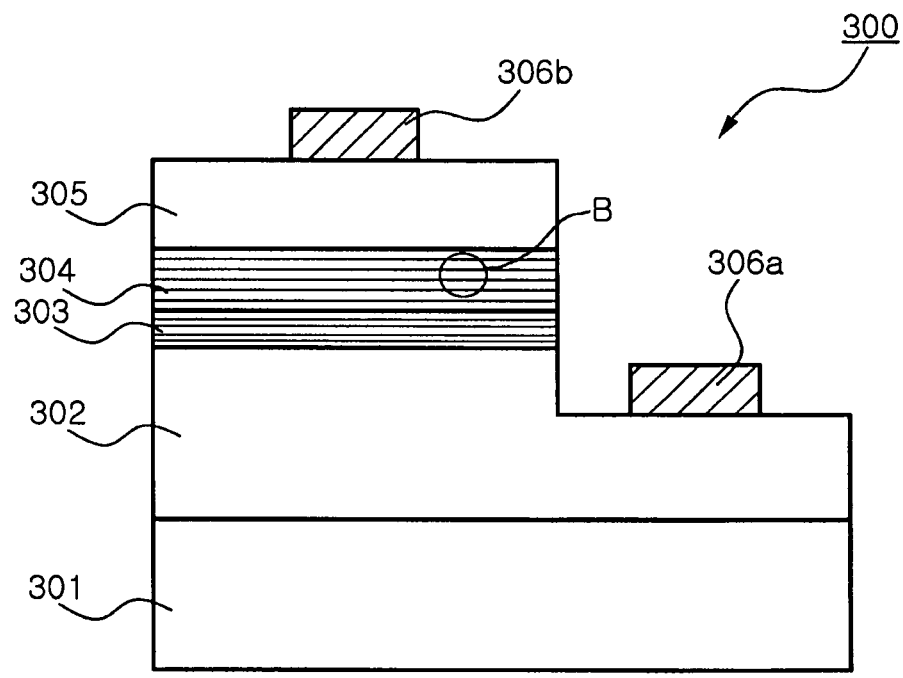
FIG. 7A is a cross-sectional view of a nitride semiconductor light emitting device according to another exemplary embodiment of the present invention.
Figure 7B:
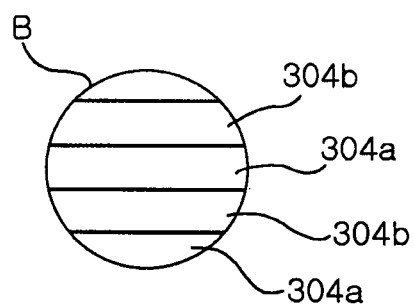
FIG. 7B is an enlarged view of an electron blocking layer region of FIG. 7A.
Figure 8:
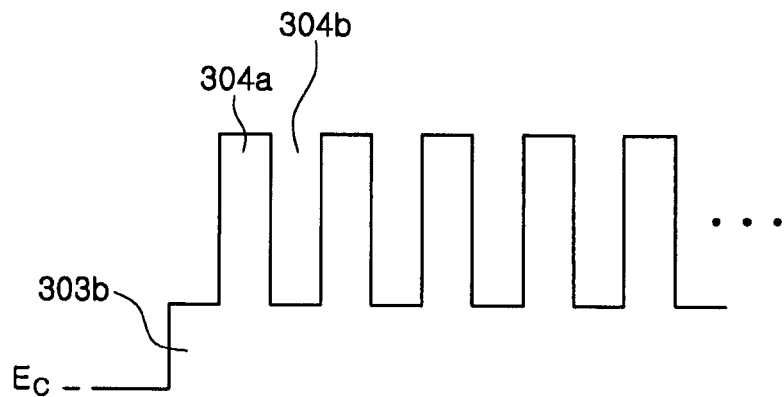
FIG. 8 illustrates the conduction band energy level of a superlattice structure and regions of neighboring layers adjacent thereto in the nitride semiconductor light emitting device of FIG. 7.

FIG. 7A is a cross-sectional view of a nitride semiconductor light emitting device according to another exemplary embodiment of the present invention, and FIG. 7B is an enlarged view of an electron blocking layer region of FIG. 7A. FIG. 8 illustrates the conduction band energy level of a superlattice structure and regions of neighboring layers adjacent thereto in the nitride semiconductor light emitting device of FIG. 7. A nitride semiconductor light emitting device 300 according to the current embodiment includes a substrate 301, an n-type nitride semiconductor layer 302, an active layer 303, an electron blocking layer 304 and a p-type nitride semiconductor layer 305. N-type and P-type electrodes 306a and 306b are respectively disposed on the n-type and p-type nitride semiconductor layers 302 and 305. Unlike in the case of the previous embodiment, the electron blocking layer 304 has a superlattice structure in which superlattice barrier layers 304a and superlattice well layers 304b having different compositions are alternately stacked. In this case, as shown in FIG. 8, the superlattice barrier layer 304a has higher energy level than the superlattice well layer 304b. One or both of the superlattice barrier layer 304a and the superlattice well layer 304b may be formed of an AlInGaN quaternary material. The superlattice barrier layer 304a and the superlattice well layer 304b may be formed of a ternary material, e.g., an AlGaN/InGaN structure. As described in the current embodiment, when the electron blocking layer 304 has the superlattice structure, the p-doping and crystalline characteristics thereof may be improved.

Meanwhile, as described in the previous embodiment, even in the case that the electron blocking layer 304 has the superlattice structure, the electron blocking layer 304 is required to have a net polarization which is matched with that of a quantum barrier layer 303b adjacent thereto. Herein, since the electron blocking layer 304 has the same characteristics as those of a material having a composition corresponding to an average composition of the superlattice structure, the properties of the electron blocking layer 304 (net polarization, bandgap energy) may be defined as the properties of the material. For example, in the case in which the superlattice barrier layer 304a and the superlattice well layer 304b have the same thickness, the properties of the electron blocking layer 304 may correspond to those of a material having a composition between that of the superlattice barrier layer 304a and that of the superlattice well layer 304b.

The electron blocking layer 304 is required to have a net polarization corresponding to that of the adjacent quantum barrier layer 303b while having greater bandgap energy than that of the adjacent quantum barrier layer 303b in order that electrons flowing toward the p-type nitride semiconductor layer 305 may be blocked thereby. To enable this, the following conditions are specifically provided. An absolute value of a net polarization mismatch between the material and the adjacent quantum barrier layer 303b may be less than two thirds (⅔) of an absolute value of a net polarization mismatch between $Al_xG_{1-x}N$ (0<x<1) having bandgap energy equal to that of the material and a composition different thereto and the adjacent quantum barrier layer 303b (i.e., ⅓ matching of net polarization). The degree of matching of net polarizations may be further increased. The absolute value of the net polarization mismatch between the material and the adjacent quantum barrier layer 303b may be less than half (½) of the absolute value of the net polarization mismatch between $Al_xG_{1-x}N$ (0<x<1) and the adjacent quantum barrier layer 303b (i.e., ½ matching), or the absolute value of the net polarization mismatch between the material and the adjacent quantum barrier layer 303b may be equal to the absolute value of the net polarization mismatch between $Al_xG_{1-x}N$ (0<x<1) and the adjacent quantum barrier layer 303b (i.e., complete matching). Here, $Al_xG_{1-x}N$ (0<x<1) represents the composition of an electron blocking layer formed of a ternary material, which is commonly used in the art to which the present invention pertains. Particularly, x may be greater than or equal to 0.1 and less than or equal to 0.2. Therefore, the terms "⅓ matching," "½ matching," and "complete matching" represent the degree of matching as compared with a case in which a general electron blocking layer is formed of $Al_xG_{1-x}N$ (0<x<1).

Figure 9:
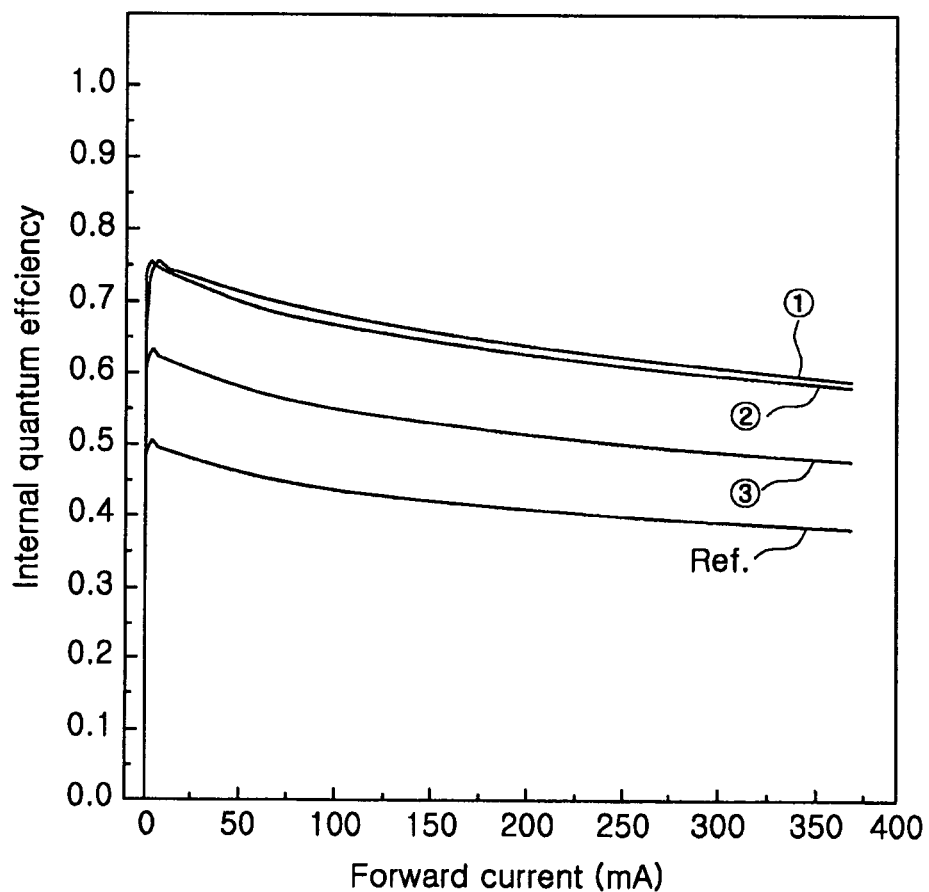
FIG. 9 is a graph showing the results of the simulation of changes in internal quantum efficiency according to a current change based on changes in the degree of matching between net polarizations of a quantum barrier layer and an electron blocking layer.

Hereinafter, effects depending on the degree of matching between net polarizations of the electron blocking layer 304 and the adjacent quantum barrier layer 303b will be described. FIG. 9 is a graph showing the results of the simulation of changes in internal quantum efficiency according to a current change based on changes in the degree of matching between net polarizations of a quantum barrier layer and an electron blocking layer. In the simulation, a GaN quantum barrier layer and an $Al_{0.13}Ga_{0.87}N$ electron blocking layer are used as a comparable composition Ref. In the case of embodiment 1, the electron blocking layer ① (having a composition corresponding to the embodiment 1 of FIG. 3) has the same bandgap energy as $Al_{0.13}Ga_{0.87}N$ and the same net polarization as the GaN quantum barrier layer. In the case of embodiment 2, the electron blocking layer ② (having a composition corresponding to the embodiment 2 of FIG. 3) has the same bandgap energy as $Al_{0.13}Ga_{0.87}N$ and the absolute value of the net polarization mismatch with the GaN quantum barrier layer, which is half (½) of the absolute value of the net polarization mismatch between $Al_{0.13}Ga_{0.87}N$ and the GaN quantum barrier layer. That is, the net polarization mismatch between the electron blocking layer ② and the GaN quantum barrier layer is half as compared with a GaN quantum barrier layer/$Al_{0.13}Ga_{0.87}N$ electron blocking layer structure. In the case of embodiment 3, the electron blocking layer ③ (having a composition corresponding to the embodiment 3 of FIG. 3) has the same bandgap energy as $Al_{0.13}Ga_{0.87}N$ and the absolute value of the net polarization mismatch with the GaN quantum barrier layer, which is one third (⅓) of the absolute value of the net polarization mismatch between $Al_{0.13}Ga_{0.87}N$ and the GaN quantum barrier layer. That is, the net polarization mismatch between the electron blocking layer ③ and the GaN quantum barrier layer is ⅓ as compared with a GaN quantum barrier layer/$Al_{0.13}Ga_{0.87}N$ electron blocking layer structure.

As shown in FIG. 9, it can be seen that the embodiment 1 having complete matching showed the highest quantum efficiency at high currents as compared with the related art, and the embodiment 2 having ½ matching and the embodiment 3 having ⅓ matching also showed improved efficiency. Therefore, in the case of utilizing ½ or ⅓ matching, the effect of polarization relaxation may be relatively low, while the crystalline properties of the electron blocking layer may be improved because Al and In contents can be reduced as compared with the case of utilizing complete matching.

Meanwhile, in addition to the matching between the net polarizations of the electron blocking layer 304 and the adjacent quantum barrier layer 303b, if the net polarizations of the superlattice barrier layer 304a and the superlattice well layer 304b are matched, a problem arising from energy-level bending may be reduced. The matching conditions within the superlattice structure are similarly set to ⅓ matching, ½ matching and complete matching. Specifically, an absolute value of a net polarization mismatch between the superlattice barrier layer 304a and the superlattice well layer 304b may be less than two thirds (⅔) of an absolute value of a net polarization mismatch between $Al_yG_{1-y}N$ (0<y<1) having bandgap energy equal to that of the superlattice barrier layer 304b and a composition different thereto and the superlattice well layer 304b (i.e., ⅓ matching), or may be less than ½ thereof or equal thereto.

In the case in which the superlattice barrier layer 304a and the superlattice well layer 304b have the same thickness, the electron blocking layer 304 may have an average composition corresponding to a composition between that of the superlattice barrier layer 304a and that of the superlattice well layer 304b. If the superlattice well layer 304b is formed of GaN and the electron blocking layer 304 has the average composition of $Al_xG_{1-x}N$ (0.1≤x≤0.2) as described above, y in $Al_yG_{1-y}N$ (0<y<1) may be greater than or equal to 0.2 and less than or equal to 0.4. Here, $Al_yG_{1-y}N$ (0<y<1) represents the composition of a general superlattice barrier layer, rather than the composition of the superlattice barrier layer 304b described in the current embodiment, and this composition is a criterion of comparison of the degree of matching with the superlattice well layer 304b. The compositions of the superlattice barrier layer 304a and the superlattice well layer 304b may be properly selected according to the degree of matching (i.e., "⅓ matching," "½ matching," and "complete matching") on the basis of the comparison with $Al_yG_{1-y}N$ (0<y<1).

Figure 10:
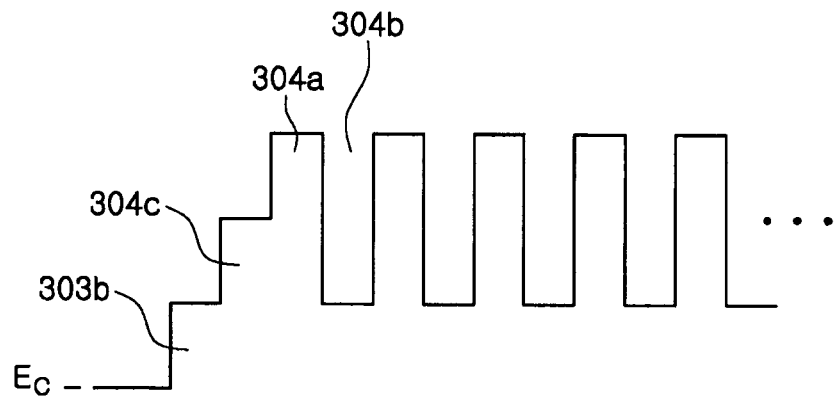
FIG. 10 illustrates the conduction band energy level of an electron blocking layer and regions of neighboring layers adjacent thereto in a nitride semiconductor light emitting device according to a modified version of FIG. 8.

FIG. 10 illustrates the conduction band energy level of an electron blocking layer and regions of neighboring layers adjacent thereto in a nitride semiconductor light emitting device according to a modified version of FIG. 8. In FIG. 10, a polarization matching layer 304c is further included to reduce a net polarization mismatch between the superlattice barrier layer 304a and the adjacent quantum barrier layer 303b. That is, in the previous embodiment, the compositions of the superlattice barrier layer 304a and the superlattice well layer 304b included in the electron blocking layer 304 may be determined based on a carrier blocking function, the matching of net polarizations within the superlattice structure, and the like. If the compositions are determined in this manner, there may be no matching between net polarizations of the adjacent quantum barrier layer 303b and the superlattice barrier layer 304a. Therefore, in the current embodiment, the polarization matching layer 304c may be provided between the superlattice structure and the adjacent quantum barrier layer 303b so as to be in contact with the adjacent quantum barrier layer 303b, and the polarization matching layer 304c may have the same net polarization as the adjacent quantum barrier layer 303b. In this case, the polarization matching layer 304c may have greater bandgap energy than the adjacent quantum barrier layer 303b. The energy-level bending between the electron blocking layer 304 and the adjacent quantum barrier layer 303b may be further reduced by the polarization matching layer 304c.

Figure 11:
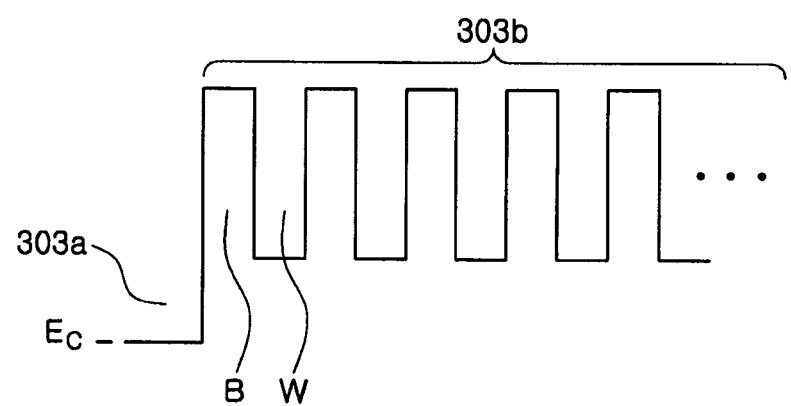
FIGS. 11 and 12 illustrate the conduction band energy level of a quantum barrier layer and regions of neighboring layers adjacent thereto in a nitride semiconductor light emitting device according to another exemplary embodiment of the present invention.
Figure 12:
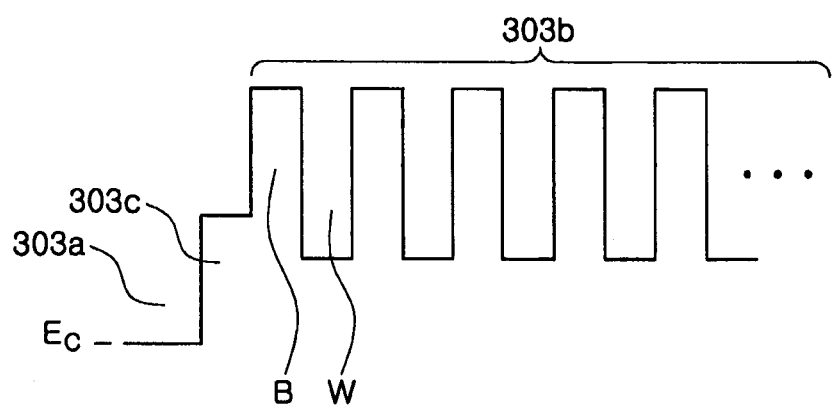

Meanwhile, such a superlattice structure may be applied to a quantum barrier layer as well as an electron blocking layer. FIGS. 11 and 12 illustrate the conduction band energy level of a quantum barrier layer and regions of neighboring layers adjacent thereto in a nitride semiconductor light emitting device according to another exemplary embodiment of the present invention. In the embodiment of FIG. 11, the active layer has a structure in which the quantum well layers 303a and the quantum barrier layers 303b are alternately stacked. Particularly, the quantum barrier layers 303b have a superlattice structure in which superlattice barrier layers B and superlattice well layers W having different compositions are alternately stacked. In this case, the net polarizations of the quantum well layer 303a and the quantum barrier layer 303b adjacent thereto are matched to be less than or equal to a predetermined value.

Specifically, an absolute value of a net polarization mismatch between a material having an average composition of the quantum barrier layer 303b, i.e., an average composition of the superlattice structure, and the quantum well layer 303a may be less than two thirds (⅔) of an absolute value of a net polarization mismatch between $In_xG_{1-x}N$ (0≤x<1) having bandgap energy equal to that of the material and a composition different thereto and the quantum well layer 303a (i.e., ⅓ matching). The degree of matching of net polarizations may be further increased to be half matched or completely matched. In this case, $In_xG_{1-x}N$ (0≤x<1) represents the composition of a quantum barrier layer formed of a ternary material or a binary material (GaN), which is commonly used in the art. A GaN quantum barrier layer is most commonly used. In the current embodiment, the quantum barrier layer may have the same bandgap energy as GaN while achieving a reduction in the net polarization mismatch with the quantum well layer.

Meanwhile, as in the case of the previous embodiment, the net polarizations of the superlattice barrier layer B and the superlattice well layer W may also be matched within the superlattice structure so as to further reduce energy-level bending. Furthermore, as shown in FIG. 12, the polarization matching layer 304c may be disposed between the superlattice structure and the quantum well layer 303a so as to be in contact with the quantum well layer 303a, and the polarization matching layer 304c may have the same net polarization as the quantum well layer 303a.

According to exemplary embodiments of the present invention, a nitride semiconductor light emitting device that can realize high efficiency by minimizing a net polarization mismatch between a quantum barrier layer and an electron blocking layer can be provided. Also, a high-efficiency nitride semiconductor light emitting device can also be provided by reducing the degree of the energy-level bending of the electron blocking layer.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor light emitting device comprising:
    n-type and p-type nitride semiconductor layers;
    an active layer disposed between the n-type and p-type nitride semiconductor layers and having a structure in which a plurality of quantum barrier layers and one or more quantum well layers are alternately stacked; and
    an electron blocking layer disposed between the active layer and the p-type nitride semiconductor layer,
    wherein the electron blocking layer has a superlattice structure in which two or more layers having different compositions are alternately stacked,
    an absolute value of a net polarization mismatch between a material, the material having a composition corresponding to an average composition of the superlattice structure, and a quantum barrier layer adjacent to the electron blocking layer among the plurality of quantum barrier layers is less than two thirds (⅔) of an absolute value of a net polarization mismatch between $Al_xGa_{1-x}N$ (0<x<1) having bandgap energy equal to that of the material and a composition different thereto and the adjacent quantum barrier layer, and
    the electron blocking layer includes a polarization matching layer disposed between the superlattice structure and the adjacent quantum barrier layer so as to be in contact with the adjacent quantum barrier layer and having a net polarization equal to that of the adjacent quantum barrier layer.

2. The nitride semiconductor light emitting device of claim 1, wherein the absolute value of the net polarization mismatch between the material and the adjacent quantum barrier layer is less than half (½) of the absolute value of the net polarization mismatch between $Al_xGa_{1-x}N$ (0<x<1) and the adjacent quantum barrier layer.

3. The nitride semiconductor light emitting device of claim 2, wherein the absolute value of the net polarization mismatch between the material and the adjacent quantum barrier layer is equal to zero.

4. The nitride semiconductor light emitting device of claim 1, wherein x is greater than or equal to 0.1 and is less than or equal to 0.2.

5. The nitride semiconductor light emitting device of claim 1, wherein the adjacent quantum barrier layer is formed of GaN.

6. The nitride semiconductor light emitting device of claim 1, wherein the average composition of the superlattice structure is a quaternary composition including Al, Ga, In and N.

7. The nitride semiconductor light emitting device of claim 1,
    wherein the superlattice structure includes superlattice barrier and well layers, and
    an absolute value of a net polarization mismatch between the superlattice barrier and well layers is less than two thirds (⅔) of an absolute value of a net polarization mismatch between $Al_yGa_{1-y}N$ (0<y<1) having bandgap energy equal to that of the superlattice barrier layer and a composition different thereto and the superlattice well layer.

8. The nitride semiconductor light emitting device of claim 7, wherein the absolute value of the net polarization mismatch between the superlattice barrier and well layers is less than half (½) of the absolute value of the net polarization mismatch between $Al_yGa_{1-y}N$ (0<y<1) and the superlattice well layer.

9. The nitride semiconductor light emitting device of claim 7, wherein the absolute value of the net polarization mismatch between the superlattice barrier and well layers is zero.

10. The nitride semiconductor light emitting device of claim 7, wherein the superlattice barrier layer has a quaternary composition including Al, Ga, In and N, and
    the superlattice well layer is formed of GaN.

11. The nitride semiconductor light emitting device of claim 7, wherein y is greater than or equal to 0.2 and is less than or equal to 0.4.

12. The nitride semiconductor light emitting device of claim 1, wherein the polarization matching layer has greater bandgap energy than the adjacent quantum barrier layer.

13. A nitride semiconductor light emitting device comprising:
    n-type and p-type nitride semiconductor layers;
    an active layer disposed between the n-type and p-type nitride semiconductor layers and having a structure in which a plurality of quantum barrier layers and one or more quantum well layers are alternately stacked; and
    an electron blocking layer disposed between the active layer and the p-type nitride semiconductor layer,
    wherein the electron blocking layer has a superlattice structure in which two or more layers having different compositions are alternately stacked,
    the superlattice structure includes superlattice barrier and well layers, and
    an absolute value of a net polarization mismatch between the superlattice barrier and well layers is less than two thirds (⅔) of an absolute value of a net polarization mismatch between $Al_yGa_{1-y}N$ (0<y<1) having bandgap energy equal to that of the superlattice barrier layer and a composition different thereto and the superlattice well layer.

14. The nitride semiconductor light emitting device of claim 13, wherein the absolute value of the net polarization mismatch between the superlattice barrier and well layers is less than half (½) of the absolute value of the net polarization mismatch between $Al_yGa_{1-y}N$ (0<y<1) and the superlattice well layer.

15. The nitride semiconductor light emitting device of claim 13, wherein the absolute value of the net polarization mismatch between the superlattice barrier and well layers is equal to zero.

16. A nitride semiconductor light emitting device comprising:
   n-type and p-type nitride semiconductor layers; and
   an active layer disposed between the n-type and p-type nitride semiconductor layers and having a structure in which a plurality of quantum barrier layers and one or more quantum well layers are alternately stacked;
   wherein at least one of the plurality of quantum barrier layers has a superlattice structure in which two or more layers having different compositions are alternately stacked,
   an absolute value of a net polarization mismatch between a material, the material having a composition corresponding to an average composition of the superlattice structure, and a quantum well layer adjacent to the superlattice structure is less than two thirds (⅔) of an absolute value of a net polarization mismatch between $In_xGa_{1-x}N$ (0≤x<1) having bandgap energy equal to that of the material and a composition different thereto and the adjacent quantum well layer, and
   the quantum barrier layer having the superlattice structure includes a polarization matching layer disposed between the superlattice structure and the adjacent quantum well layer so as to be in contact with the adjacent quantum well layer and having a net polarization equal to that of the adjacent quantum well layer.

17. The nitride semiconductor light emitting device of claim 16, wherein x is 0.

* * * * *